United States Patent [19]
Ozawa et al.

[11] Patent Number: 5,286,994
[45] Date of Patent: Feb. 15, 1994

[54] SEMICONDUCTOR MEMORY TRAP FILM ASSEMBLY HAVING PLURAL LAMINATED GATE INSULATING FILMS

[75] Inventors: Takanori Ozawa; Noriyuki Shimoji, both of Kyoto, Japan

[73] Assignee: Rohm Co., Ltd., Kyoto, Japan

[21] Appl. No.: 902,896

[22] Filed: Jun. 23, 1992

[30] Foreign Application Priority Data

Aug. 22, 1991 [JP] Japan ................... 3-210789

[51] Int. Cl.$^5$ ............ H01L 29/68; H01L 29/78; H01L 29/34
[52] U.S. Cl. ................... 257/411; 257/324; 257/325; 257/410; 257/637; 257/640
[58] Field of Search ................ 257/15, 17, 20, 28, 257/324, 325, 410, 411, 637, 640

[56] References Cited

U.S. PATENT DOCUMENTS

| | | | |
|---|---|---|---|
| 3,649,884 | 3/1972 | Haneta | 257/325 |
| 4,151,537 | 4/1979 | Goldman et al. | 257/324 |
| 4,242,737 | 12/1980 | Bate | 257/411 |
| 4,335,391 | 6/1982 | Morris | 257/324 |

*Primary Examiner*—Ngan Ngo
*Attorney, Agent, or Firm*—Wenderoth Lind & Ponack

[57] ABSTRACT

A trap film assembly of a semiconductor memory device includes a tunnel oxide layer formed on a semiconductor substrate and plural multi-layer film layers laminated on the tunnel oxide film. A thickness of each multi-layer film layer is sequentially increased in a direction away from the semiconductor substrate and towards a gate electrode, thereby displacing the charge centroid of the assembly towards the semiconductor substrate.

4 Claims, 1 Drawing Sheet

SEMICONDUCTOR MEMORY TRAP FILM ASSEMBLY HAVING PLURAL LAMINATED GATE INSULATING FILMS

BACKGROUND OF THE INVENTION

The present invention generally relates to a semiconductor memory device, and more particularly, to a nonvolatile transistor memory having a gate insulating assembly for trapping charges which includes two or more types of alternately laminated insulating thin films and a tunnel oxide film located on a semiconductor substrate.

Some conventional semiconductor readable and writable memory transistors, which store information by the accumulation of electric charges, have a MNOS (metal-film nitride-oxide film-semiconductor) construction. The minimum thickness of a nitride film of the MNOS device is 190 Å. An oxide film is formed on the upper surface of the nitride film to achieve a relatively thin gate insulating film structure to cope with lower voltages and to obtain higher speed memory elements. However, the injection of holes from the gate electrode can lead to element deterioration due to the thin gate insulating film structure.

In one proposed memory device, a tunnel oxide film is provided on a silicone substrate for trapping an electric charge thereon, and a gate electrode is provided on the trap film. By application of a voltage upon the gate electrode, an electric charge is trapped on the trap film from the channel portion of the transistor device. After the gate voltage has been removed, the channel is retained in an on or off state according to an electric field resulting from the trapped electric charge.

In one type of device, a nitride film or mixed film is used as a trap film. In another type of device, an oxide film is provided on the trap film so that erasing and writing operations can be effected using a low voltage. The oxide film prevents the injection of holes from the electrode and the thrusting of electrons into the electrode. However, since a relatively high voltage is applied to the oxide film, defects occur as the writing and erasing voltage increases, and detrap of electrons and injection of holes are caused thus reducing the injection efficiency of electrons.

SUMMARY OF THE INVENTION

Accordingly, the present invention has been developed with a view to substantially eliminating the above discussed drawbacks inherent in the prior art and has for its essential object to provide an improved semiconductor memory device.

Another important object of the present invention is to provide a novel and highly reliable semiconductor memory device which is provided with sufficient memory capabilities even when a writing operation has been effected with a low voltage.

In accomplishing these and other objects, according to one preferred embodiment of the present invention, a semiconductor non-volatile memory transistor includes a trap film assembly having a tunnel oxide film provided on a semiconductor substrate, and two or more types of insulating thin films alternately laminated on the tunnel oxide film. At least one of each of the two or more types of insulating thin films has a thickness which is sequentially increased in a direction away from the semiconductor substrate so that the electric charge centroid of the trap film assembly is displaced towards the semiconductor substrate.

In an embodiment of the invention, the trap film assembly includes, for example, one type of insulating films of a constant film thickness and another type of insulating films of increasing film thickness, i.e., the film thickness is increased gradually in the direction towards the gate electrode from the semiconductor substrate. Oxide films in the assembly work as a brake of the electric charges injected from the silicone which are trapped in the trap film assembly with efficiency and without being thrust as far as the gate electrode. With the use of the trap in the film boundary, the interval of the two or more types of insulating films is determined, and the position of the electric charge centroid in the laminated film assembly is displaced towards the semiconductor substrate.

According to a semiconductor non-volatile memory transistor of such construction as described hereinabove, the electric charge is trapped with a low average trap length because of the plurality of insulating thin film potentials, having a large number of band gaps, existing in the trap film. Thus, a thinner film of the trap film assembly can be effected or the traps in the boundary are used, with an advantage arising in that deterioration of the Vth shift in data retention is reduced. As the interval of each insulating film becomes a parameter of the Vth shift, the optimum Vth shift is easier to achieve.

BRIEF DESCRIPTION OF THE DRAWINGS

These and other objects and features of the present invention will become apparent from the following description taken in conjunction with the preferred embodiment thereof with reference to the accompanying drawings, in which.

DETAILED DESCRIPTION OF THE INVENTION

Figure 1:
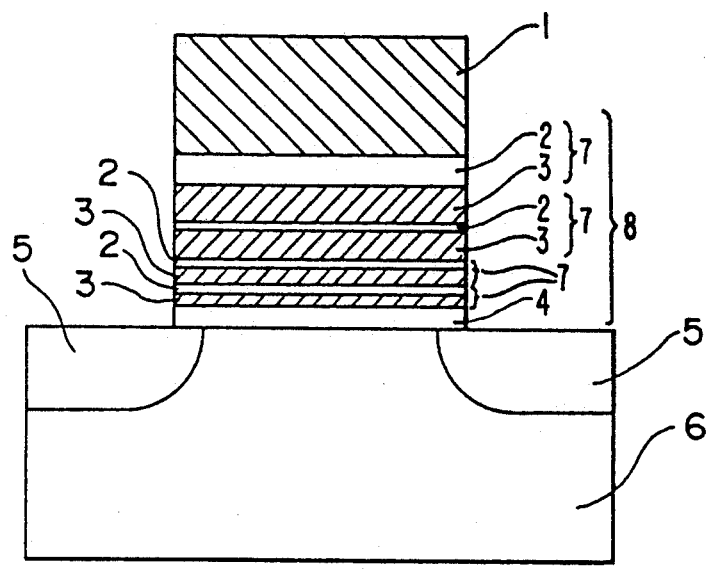
FIG. 1 is a sectional view showing the configuration of a memory transistor of the present invention.

Referring now to the drawings, there is shown in FIG. 1 a memory transistor according to one preferred embodiment of the present invention, which includes a semiconductor substrate 6, a source and a drain 5, a tunnel film oxide film 4, plural multi-layer films 7 each composed of a plurality of different types of insulating films 2, 3, and a gate electrode 1. The oxide film 4 and the multi-layer films 7 form a gate insulating trap film assembly 8 of the memory transistor.

The tunnel oxide film 4 of the trap film assembly 8 is provided on the semiconductor substrate. Further, the different insulating thin films 2 and 3 of the multi-layer films 7 are alternately laminated on the tunnel oxide film 4 to form the trap film assembly 8. As shown in FIG. 1, the film relative thickness of each multi-layer film 7 is sequentially increased in a direction away from the semiconductor substrate 6 whereby, as explained below, the electric charge centroid of the trap film assembly 8 is displaced towards the semiconductor substrate 6.

In the present embodiment, four layers of nitride films 3 and oxide films 2 are alternately formed on the tunnel oxide film 4 by thermal oxidation, CVD sputtering or the like to form the trap film assembly 8. The total trap film thickness is about 10 nm and that of the tunnel oxide film 4 is 2 nm or lower. Electric charges are trapped in the boundaries between the nitride films 3 and oxide films 2 or in the nitride films, with energies being lost while passing a barrier of the oxide films 2 in the trap film assembly.

Similar transistor characteristics are obtained with the use of insulating films other than oxide and nitride films. When extremely thin oxide films are difficult to accumulate, the band gap becomes smaller than the oxide films. When films having larger band gaps than the insulating films, for example, $Al_1O_3$ or the like are used, the film thickness thereof need only to be made larger than the oxide film.

The electric charge centroid bar d of the device is set according to the intervals between the respective insulating thin films 2 and 3. In particular, when SiN and $SiO_2$ are used as the alternately laminated insulating films 2 and 3, and when the electric charge accumulated in the trap film assembly is constant, the Vth shift of the device is determined by $$\Delta V_{FB} \propto (X_{OX} + AX_N - \bar{d}_{OX} - A\bar{d}_N)$$

where,
$\bar{d} = \bar{d}_{OX} + \bar{d}_N$,
$A = \epsilon_{OX}/\epsilon_N$,
$\bar{d}_{OX}$ is the total $SiO_2$ film thickness between the centroid bar d and the boundary between the substrate 6 and the tunnel oxide film 4,
$\bar{d}_N$ is the total SiN film thickness between the centroid bar d and the boundary between the substrate 6 and the tunnel oxide film 4,
$X_{OX}$ is the total film thickness of the oxide films,
$X_N$ is the total film thickness of the nitride films,
$\epsilon_{OX}$ is the dielectric constant of the oxide films, and
$\epsilon_N$ is the dielectric constant of the nitride films.

Therefore, by sequentially increasing a thickness of at least one of the insulating films 2 and 3 (i.e., by sequentially increasing a thickness of each multi-layer film 7) in a direction away from the semiconductor substrate 6, the electric charge centroid of the trap film assembly 8 is moved towards the semiconductor substrate 6 to become relatively closer to the semiconductor substrate 6.

In the device of the present invention, the electric charge centroid of the trap film assembly is displaced towards the semiconductor substrate and deterioration of the memory window after data retention is less as compared with the trap in the boundary than the trap in the film. As the thinner film thickness of the trap film assembly is less in the trap electric charge, the Vth becomes lower, and the deterioration of the Vth is found to be small. When the trap electric charge is less as a whole, the boundary trap need only to be increased by the lamination of the two or more types of insulating films.

Figure 2:
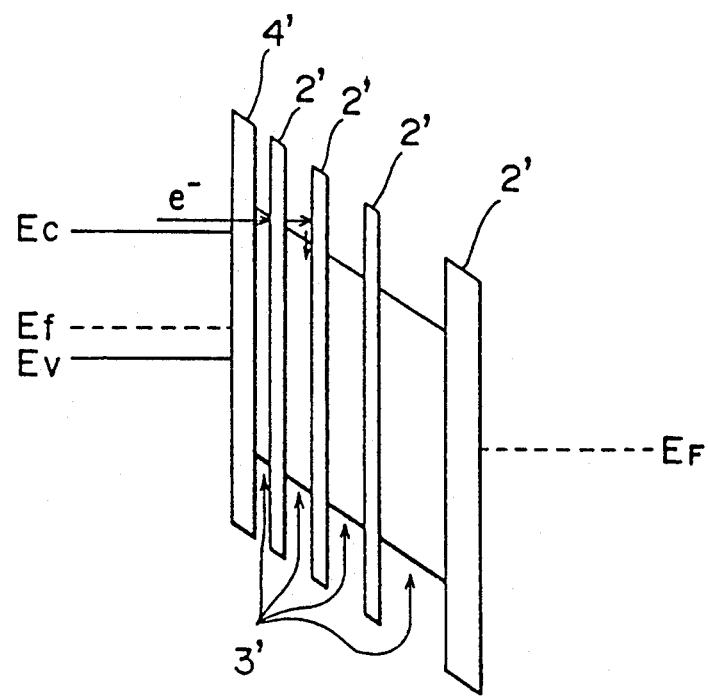
FIG. 2 is a perspective view showing energy bands disposed between a gate electrode and a semiconductor substrate of the memory transistor of FIG. 1.

According to a trap type semiconductor non-volatile memory transistor of such construction as described hereinabove, referring to FIG. 2, an electric charge e. is trapped with a low average trap length because of the insulating thin film potentials, having a large number of band gaps 2', 3' and 4', existing in the trap film. Thus, a thinner film of the trap film assembly can be effected or the trap in the boundary is used, with an advantage arising in that deterioration of the Vth shift in data retention is reduced. As the interval of each insulating film becomes a parameter of the Vth shift, the optimum Vth shift is easier to achieve.

What is claimed is:

1. A semiconductor non-volatile memory comprising:
    a semiconductor substrate having diffusion regions defining a channel region therebetween;
    a gate electrode; and,
    a trap film assembly interposed between said channel region of said semiconductor substrate and said gate electrode, said trap film assembly for trapping charges to maintain a memory state of the semiconductor non-volatile memory and including
        a tunnel oxide film located on said semiconductor substrate along said channel region,
        plural stacked multilayer insulating film layers successively located between said tunnel oxide film and said gate electrode, each multilayer film layer including at least two layers of respectively different insulating films, wherein a vertical thickness in a direction between said channel region and said gate electrode of each respective multilayer film layer is successively increased from a first one of said plural multilayer film layers located adjacent said tunnel oxide film to a last one of said plural multilayer film layers located adjacent said gate electrode, and wherein a electric charge centroid of said trap film assembly is located relatively closer to said semiconductor substrate than to said gate electrode.

2. A semiconductor non-volatile memory as claimed in claim 1, wherein a vertical thickness of at least one of said at least two layers of respectively different insulating films is successively increased in each of said multilayer film layers in a direction away from said semiconductor substrate.

3. A trap film assembly of a semiconductor non-volatile memory for trapping charges to maintain a memory state of said semiconductor non-volatile memory, comprising:
    a tunnel oxide film located on a semiconductor substrate;
    plural stacked multilayer insulating film layers successively located between said tunnel oxide film and an electrode of the semiconductor non-volatile memory, each multilayer film layer including at least two layers of respectively different insulating films, wherein a vertical thickness in a direction between the semiconductor substrate and the electrode of each respective multilayer film layer is successively increased from a first one of said plural multilayer film layers located adjacent said tunnel oxide film to a last one of said plural multilayer film layers located adjacent the electrode, and wherein a electric charge centroid of said trap film assembly is located relatively closer to the semiconductor substrate than to the electrode.

4. A trap assembly as claimed in claim 3, wherein a vertical thickness of at least one of said at least two layers of respectively different insulating films is successively increased in each of said multilayer film layers in a direction away from said semiconductor substrate.

* * * * *